United States Patent

Soto

[11] Patent Number: 5,414,919
[45] Date of Patent: May 16, 1995

[54] APPARATUS FOR REMOVING METALLIZED LEADS BONDED TO METALLIZED BOND PADS

[75] Inventor: Vicente Soto, Riverside, Calif.

[73] Assignee: Hughes Aircraft Company, Los Angeles, Calif.

[21] Appl. No.: 278,592

[22] Filed: Jul. 21, 1994

Related U.S. Application Data

[63] Continuation of Ser. No. 894,979, Jun. 8, 1992, abandoned.

[51] Int. Cl.$^6$ .............................................. B23P 23/04
[52] U.S. Cl. ...................................... 29/33 R; 29/426.5
[58] Field of Search ................. 29/33 A, 76.4, 81.11, 29/81.16, 426.4, 426.5, DIG. 98, 33 R; 15/93.4, 256.5; 156/584

[56] References Cited

U.S. PATENT DOCUMENTS

| | | | |
|---|---|---|---|
| 2,120,300 | 6/1938 | Taylor | 29/76.4 |
| 2,333,285 | 11/1943 | Wellnitz | 15/93.4 X |
| 2,832,126 | 4/1958 | Galloway | 29/76.4 |
| 3,217,348 | 11/1965 | Simmons | 15/93.4 |
| 3,602,940 | 7/1971 | Barbeau et al. | 15/256.5 X |
| 3,691,588 | 9/1972 | Hennig et al. | 15/256.5 |
| 4,855,012 | 8/1989 | Sumi | 156/584 |
| 5,000,814 | 3/1991 | Sumi | 156/584 X |
| 5,218,412 | 6/1993 | Martin | 15/256.5 X |
| 5,253,398 | 10/1993 | Markiewicz | 29/33 A |
| 5,263,620 | 11/1993 | Hernandez et al. | 29/426.4 |
| 5,344,506 | 9/1994 | De Angelis | 29/426.5 |

FOREIGN PATENT DOCUMENTS 410539  5/1934  United Kingdom ............... 29/81.11

OTHER PUBLICATIONS

Dage Series 22 Microtester Data Sheet Reference 4/88/DB/0/1/5K by Dage Precision Industries Inc., 46701 Fremont Blvd., Fremont, Calif 94538 (8 pages).

*Primary Examiner*—Irene Cuda
*Assistant Examiner*—Marc W. Butler
*Attorney, Agent, or Firm*—Elizabeth E. Leitereg; Terje Gudmestad; W. K. Denson-Low

[57] ABSTRACT

Lead wires extending out from an electrical circuit device are removed from respective bonding pads to which they are bonded by a lateral shearing action. Shearing can be accomplished either unidirectionally, or with a bidirectional reciprocating movement. A shearing tool is provided with a single shearing projection for a unidirectional shearing, or with a pair of spaced shearing projections for bidirectional shearing. A vertical alignment is established between the tool and a first lead to be sheared, and this initial alignment is also used for shearing the other leads of the device. With the actual bond between a lead and its bonding pad occupying only a minor portion of the available surface area, a subsequent lead from a replacement device is bonded to the same bonding pad as the first lead by forming a new bond at a different site along the pad.

9 Claims, 5 Drawing Sheets

APPARATUS FOR REMOVING METALLIZED LEADS BONDED TO METALLIZED BOND PADS

This is a continuation of application Ser. No. 07/894,979 filed Jun. 8, 1992, abandoned.

BACKGROUND OF THE INVENTION

1. Field of the Invention

This invention relates to the reworking of electrical circuit packages, and more particularly to methods and apparatus for the automated removal of lead wires from bonding pads to which they are connected so that a defective circuit package may be replaced with a new one.

2. Description of the Related Art

TAB (tape automated bonding) integrated circuit (IC) chips are generally formed with straight lead wires that extend laterally out from the chip. To mount and electrically connect the chip to a circuit board or other substrate, the chip is generally first secured to the substrate with an adhesive. The lead wires are then bent down to contact corresponding bonding pads that surround the chip, and are joined to the pads by a technique such as thermosonic, ultrasonic or thermo-compression bonding. If the circuit device should thereafter become damaged or otherwise malfunction, it is desirable that both it and its leads be removed from the substrate so that it can be replaced with a functional chip that uses the same contact pads.

If the leads were originally solder bonded, they need merely be heated to reflow the solder and remove the lead from the bonding pad. However, solder bonds are generally not as reliable as thermosonic, ultrasonic or thermo-compression bonds. For the latter type of bonding, two techniques have commonly been used to remove the leads of a defective chip from their respective bonding pads. In the first, illustrated in FIG. 1, the bonding pad 2 is elongated and the lead wire 4 is bonded to the pad at a location 6 towards the opposite end of the pad from the IC chip. To remove the lead wire, it is simply cleaved along a bend line 8 where it to joins the pad. The portion of the lead on the chip side of this line is then removed along with the chip, while the foot 10 of the lead is left bonded to the pad 2. The lead wire 12 for the replacement chip is bonded at a different location on the pad 2, inward from the residual foot 10 of the first lead. If the second chip also needs to be removed, its leads are severed in a manner similar to the leads of the first chip, leaving the foot of each replacement lead still attached to its respective bonding pad. A third lead wire 14 can then be bonded to the pad at a location along the pad that is still further inward towards the chip. While this rework method is subject to automation and is therefore relatively efficient in terms of the amount of time required, the elongated contact pads increase the amount of substrate area that must be dedicated to each separate chip. This results in a corresponding reduction in the circuit density that can be accommodated.

A second technique, illustrated in FIG. 2, allows for the use of a shorter contact pad 16 that can accommodate only a single lead. In this approach the lead for a defective chip is severed as in the technique of FIG. 1, leaving the foot 18 of the first lead attached to the bonding pad. The foot 20 of the next lead is then bonded directly over the foot 18 of the first lead. In FIG. 2 the assembly is illustrated after a second reworking, in which the foot 20 of the second lead has been severed and a third lead 22 has been bonded to the upper surface of second lead foot 20. While this approach allows for a higher circuit density than in FIG. 1, the compound lead bonding in which bonds are made to previous bonds results in a poor bonding reliability for the replacement leads.

SUMMARY OF THE INVENTION

The present invention seeks to provide a lead wire reworking technique and system that permits the use of short bonding pads and a consequently high circuit density, produces highly reliable reworked bonds, is subject to automation with available equipment and allows for numerous successive reworkings.

These goals are achieved with the use of a shearing tool that dislodges each lead from its respective bonding pad by applying a lateral shear pressure to the lead at a location offset from its bonding pad. The shear pressure can be applied either unidirectionally, in which case the lead may be pushed all the way laterally off its bonding pad, or in a bidirectional reciprocating fashion so that the lead is dislodged without moving it as far relative to its bonding pad.

The substrate is preferably placed on a movable X-Y table for rework, with the shearing tool movable in a vertical direction; movements of both the table and the shearing tool are preferably governed by an automated controller. The tool is provided with either a single shearing projection for unidirectional shearing, or with a pair of spaced shearing projections for a bidirectional reciprocating shearing movement. The tool is initially aligned over a vertical reference consisting of either the first contact pad or the adjacent substrate, and lowered until it reaches the reference level. From this point it is elevated back up to a predetermined shearing height above the pad. The downward movement of the shearing tool is stored so that, after the first pin has been sheared off its pad, the tool is raised as the table is advanced to the next lead position and the tool is then lowered directly to the desired shearing height for the next lead, without having to first reach a vertical reference level for the next lead.

Since the actual bond between the lead and its contact pad extends over only a minor portion of the adjacent lead/pad surface areas, even if some residual material is left a new lead wire can be attached to the same location on the pad by moving its bonding site away from the bonding site for the first lead. The invention thus allows for multiple successive leads to be bonded over the same area of a single contact pad, with each successive lead securely attached to the pad until it is sheared off.

Further features and advantages of the invention will be apparent to those skilled in the art from the following detailed description, taken together with the accompanying drawings, in which:

DETAILED DESCRIPTION OF THE INVENTION

Figure 1:
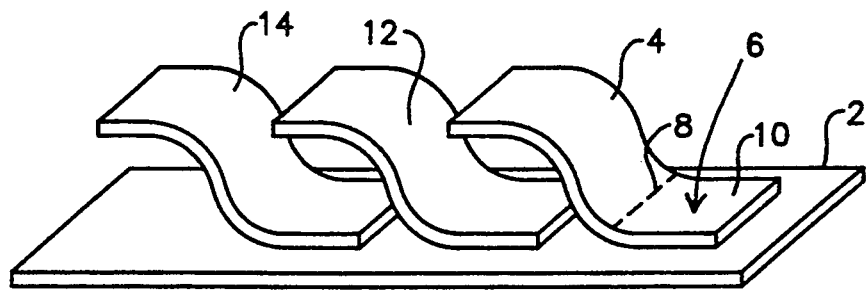
FIGS. 1 and 2 are perspective views, described above, illustrating two prior lead wire rework techniques.
Figure 2:
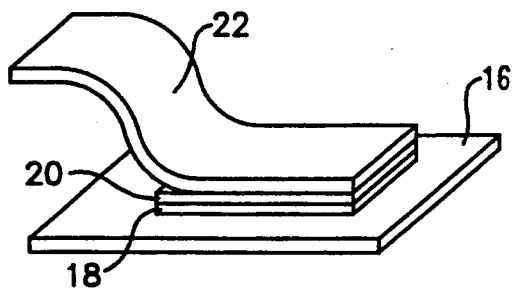
Figure 3:
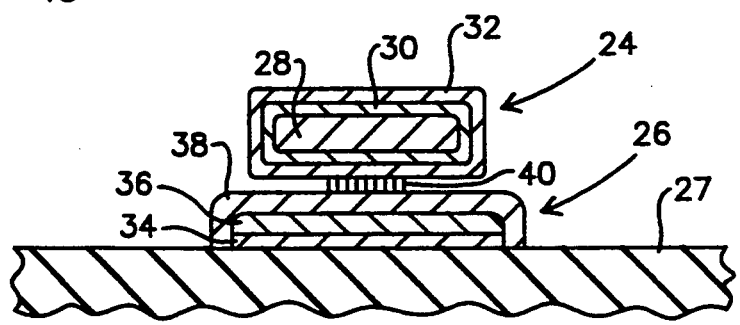
FIG. 3 is a sectional view of a typical bond between a lead wire and a bonding pad.

A typical bond between a TAB lead 24 and an underlying bonding pad 26 is illustrated in FIG. 3. The pad 26 is attached to the upper surface of an insulative substrate 27, such as a printed wiring board, over which metallized conductors electrically interconnect the bonding pads to other circuit devices or to input/output ports. The lead 24 commonly has a copper core 28, a thin nickel layer 30 surrounding the core, and an outer gold plating 32. A complementary bonding pad 26 would have an aluminum base 34, a nickel layer 36 over the base, and an outer gold plating 38. The bond 40 (shown with an exaggerated vertical dimension) between the lead and pad gold platings occupies an area that is substantially less than the full opposed surface areas of the lead and pad. While gold platings are commonly employed, the invention also applies to other types of bonds that may be used, such as silver-silver, aluminum-aluminum, gold-aluminum, gold-copper, nickel-nickel and other combinations.

Figure 4A:
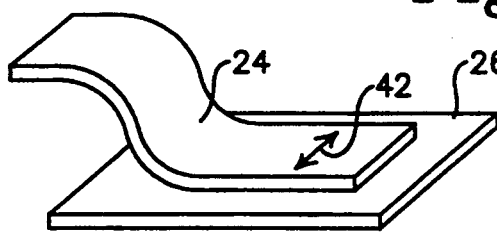
FIGS. 4a and 4b are perspective views showing a bonding pad before and after the removal of a lead wire in accordance with the invention.
Figure 4B:
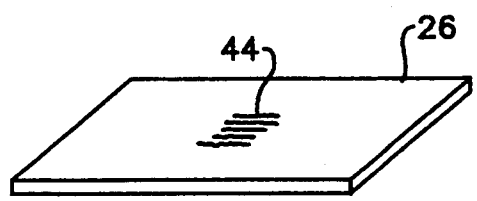

FIG. 4a is a perspective view of the lead 24 bonded to the bonding pad 26, while FIG. 4b is a perspective view of the bonding pad 26 after the lead has been removed in accordance with the invention. The lead is dislodged by applying a lateral sheering force to it in a direction indicated by arrow 42 in FIG. 4a. A residual portion of the gold plating from the lead will typically be left on the surface of the bonding pad after the lead has been sheared off. The residual gold will be located at the original bonding site 44 (FIG. 4b) between the lead and pad; this bonding site typically occupies only a minor portion of the available bonding pad surface area.

Figure 5:
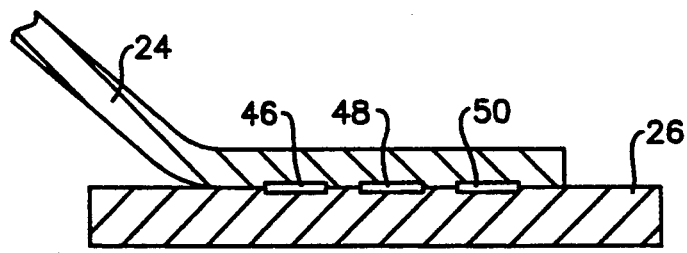
FIG. 5 is a sectional view showing alternate bonding locations between a lead and bonding pad.

A sectioned view of the lead 24 and bonding pad 26 is presented in FIG. 5, with three different potential bonding sites 46, 48 and 50 between the two elements illustrated. In accordance with the invention, a bond is established between the lead and the underlying pad at one of these bonding sites. After the lead has been sheared off and its associated IC package replaced with a new one, the new lead can be bonded to the pad in another of the areas 46, 48, 50 that was not used to bond the lead for the first chip. If the circuit is again reworked and the new chip replaced, a third lead can be bonded to the pad at the third available site. In this manner successive leads can be bonded directly to the pad without having to extend the pad's length.

Figures 6A, 6B, 6C:
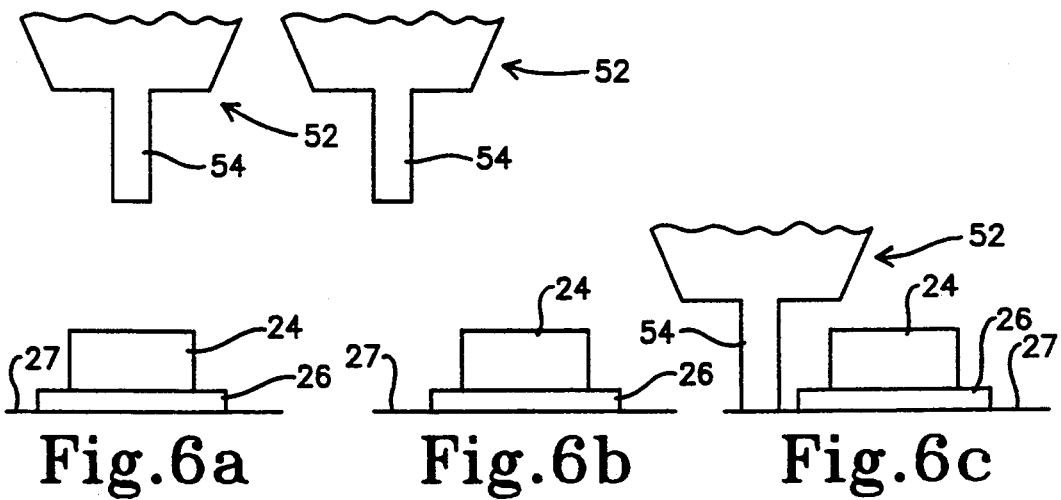
FIGS. 6a–6f are illustrative elevation views showing successive steps in the removal of a lead from its bonding pad with a unidirectional shearing action.
Figure 6D:
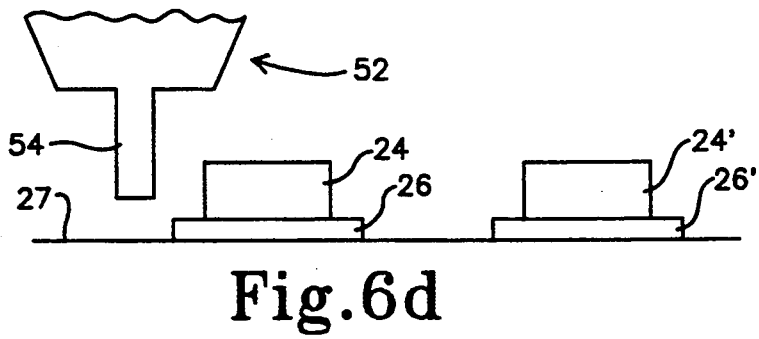

One method for shearing off the lead 24 from its bonding pad 26 is illustrated in FIGS. 6a–6f. A shearing tool 52 that has a head from which a shearing projection 54 extends downward is employed. The shearing tool is initially aligned over the center of the lead, as shown in FIG. 6a. In the next step, shown in FIG. 6b, the shearing tool 52 has been moved to the left relative to the lead 24. In the preferred embodiment this movement is accomplished by placing the substrate 27 on a movable X-Y table and moving the table to the right while the tool 52 is held stationary; details of the motion control mechanism are provided below.

The shearing tool 52 is then lowered until the bottom surface of projection 54 contacts the upper surface of substrate 27, as illustrated in FIG. 6c. This establishes a vertical reference point for the subsequent shearing operation. In the next step (FIG. 6d) the shearing tool 52 is raised to a pre-programmed shearing height above the surface of substrate 27, at which height the projection 54 clears the bonding pad 26 but is horizontally aligned with the major portion of lead 24. The lead is typically about 0.5–1.5 mils in height, and the lower edge of the shearing projection 54 is typically elevated about 0.2–0.5 mils above the upper bonding pad surface. The next adjacent bonding pad and lead are indicated by reference numerals 24' and 26', respectively.

Figure 6E:
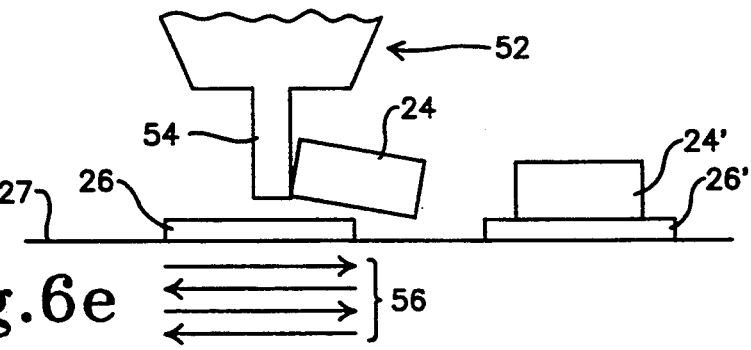
Figure 6F:
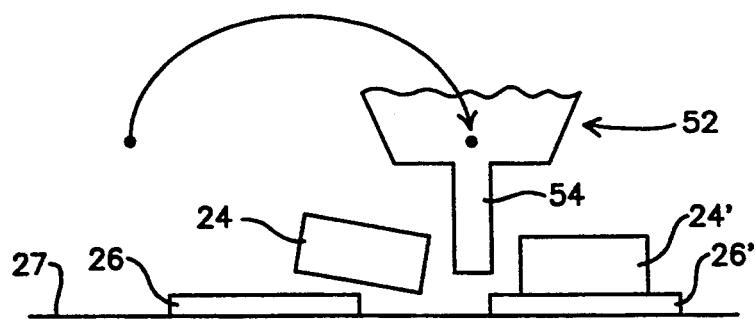

The actual shearing operation is accomplished by establishing a relative lateral movement between the shearing tool 52 and lead 24 such that the side of the shearing projection 54 abuts against and applies a lateral pressure to the lead 24. In the preferred embodiment this is accomplished by moving the X-Y table to the left so that the lateral surface of lead 24 pushes against the side of the shearing projection 54. As illustrated in FIG. 6e, this action breaks the bond between the lead and bonding pad, shearing the lead 24 off the pad 26. Although it will generally not be necessary to move the shearing tool relative to the pad all the way to the right lateral edge of the pad, a lateral movement of this magnitude is generally desirable so that any debris left on the pad from the lead may be removed (at least down to the lower surface of shearing projection 54). This type of cleanup is particularly useful with gold plated leads, since gold is malleable and can deform and leave deposits on the bonding pad when the lead is sheared off. In a similar fashion, the shearing tool 52 can be reciprocated back and forth relative to the bonding pad to scour the upper surface of the pad. Such a reciprocating motion is indicated by arrows 56 in FIG. 6e, which correspond to the successive relative movements between the bonding pad and shearing tool.

Once the shearing operation for lead 24 has been completed, the shearing tool 52 is advanced to the next lead 24' and contact pad 26'. This is preferably accomplished by pre-programmed vertical and horizontal movements that can be conducted simultaneously. The shearing tool 52 is raised vertically upward so that projection 54 clears the underlying lead 24, while the X-Y table moves horizontally to advance the next lead 24' to the shearing tool location. The height to which the shearing tool is raised should only slightly exceed the height of the lead 24 to minimize the time required for the movement. However, the lead will normally be bonded to its bonding pad under a spring tension that causes the lead to rise upward somewhat when it has been released from its pad, and the pre-programmed upward movement of the shearing tool should take this into account. Once the lead 24 has been cleared, the shearing tool is lowered again to the position shown in FIG. 6f, where it is ready to begin shearing the next lead 24'. Since the vertical reference provided by the upper surface of substrate 27 has already been established prior to shearing the first lead 24, the shearing tool motion controller can be programmed to store this reference and to lift the tool to a clearance height and then lower it directly to the shearing height shown in FIG. 6f, without having to again establish a vertical reference by again contacting the substrate.

An alternate shearing technique is illustrated in FIGS. 7a-7e. In this approach a shearing tooling 58 has a head from which a pair of shearing projections 60 and 62 extend downwardly. The projections 60 and 62 are spaced apart from each other by slightly more than the width of the lead 24 to sheared, and are preferably greater in vertical extent than the lead height. They have mutually opposed inner walls 64 and 66, respectively, that alternately engage the lateral sides of the lead 24 to shear it from the contact pad 26 in a back-and-forth shearing motion.

Figures 7A, 7B:
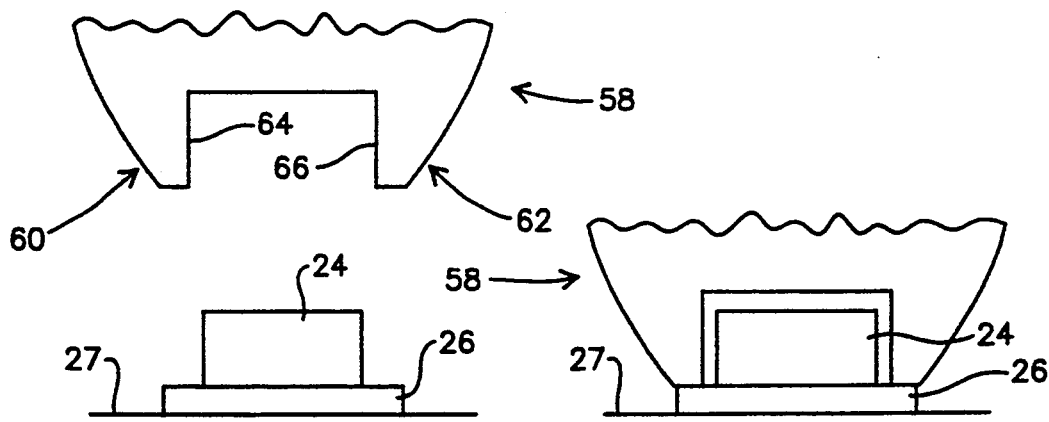
FIGS. 7a–7e are illustrative elevation views showing successive steps in the removal of a lead from its bonding pad with a reciprocating shearing action.
Figures 7C, 7D:
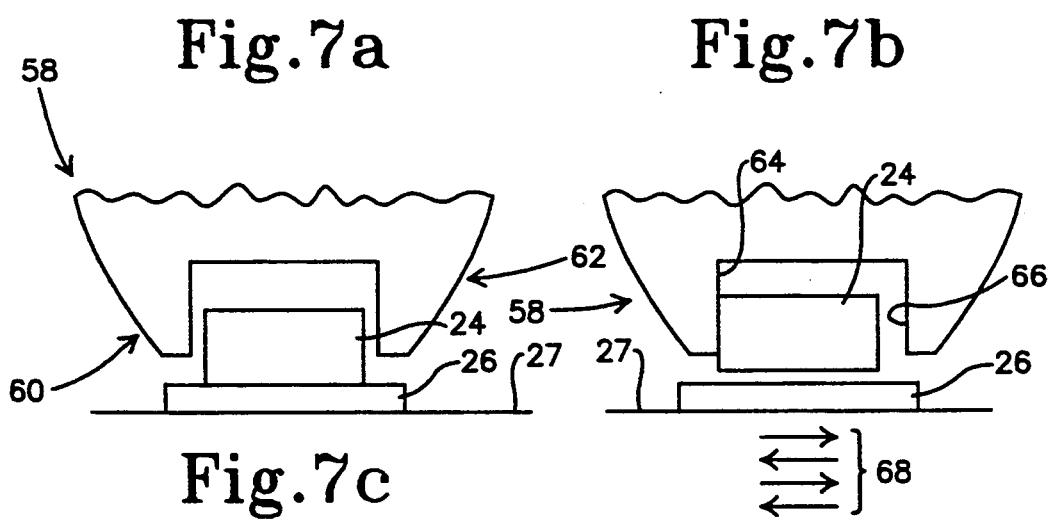

The shearing tool 58 is initially aligned vertically over the lead 24 as illustrated in FIG. 7a. It is then lowered until the bottom surfaces of projections 60 and 62 strike the upper surface of bonding pad 26 lateral to the lead 24, as shown in FIG. 7b. This establishes a vertical reference for the subsequent shearing operation in a manner similar to FIGS. 6a-6f, although the vertical reference point in this instance is the upper bonding pad surface rather than the upper surface of substrate 27. The shearing tool 58 is then elevated slightly above the upper bonding pad surface (FIG. 7c), with the lead 24 still between the projections 60 and 62. Next, as illustrated in FIG. 7d, the shearing tool 58 is reciprocated horizontally back and forth relative to the lead, with the left projection wall 64 applying a shearing pressure to the left side of the lead when the tool motion relative to the lead is to the right, and the right projection wall 66 applying a shearing pressure to the right side of the lead when the tool movement relative to the lead is to the left. The reciprocating motion is continued for a number of iterations, as indicated by arrows 68, to completely shear the lead 24 from the bonding pad 26 and allow the lead to rise up under it spring tension. An advantage of this technique is that the reciprocal tool movements relative to the lead can be relatively short and the lead is not pushed off to the side of the bonding pad; this allows enough room for the use of the tool even when adjacent leads are packed closely together. The projections 60 and 62 are preferably narrow enough for their outer edges to scour the outer portions of the bonding pad during the reciprocating shearing motion.

Figure 7E:
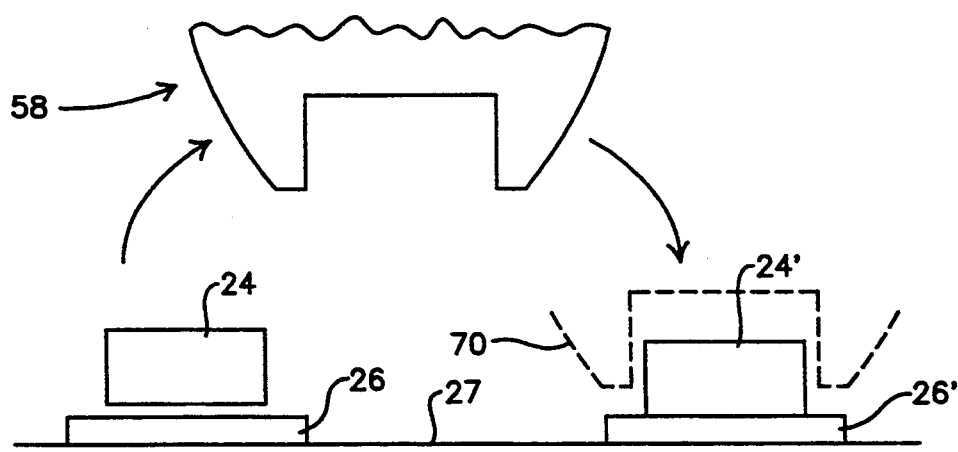

After the lead 24 has been sheared from its bonding pad, the shearing tool 58 is advanced to the next lead 24' by raising it vertically, moving the X-Y table to shift the new lead 24' into alignment below the tool, and lowering the tool to the position indicated by dashed lines 70 in FIG. 7e. The tool can be moved directly to a shearing position slightly above the bonding pad 26', without having to establish a new vertical reference, by retaining the level of the upper surface of the first bonding pad 26 as a vertical reference for all of the subsequent leads for the chip.

Figure 8A:
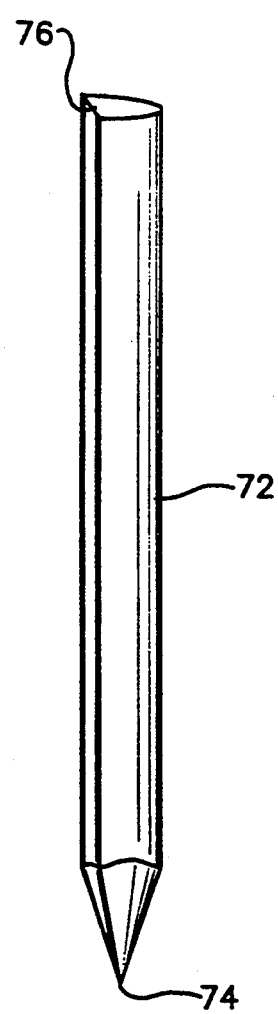
FIGS. 8a, 8b, 8c, 8d and 8e are perspective views respectively of a shearing tool used in the new reworking process, and of three different shearing head configurations that may be employed at the tip of the tool.

A type of shearing tool that can be used with the invention is shown in FIG. 8a. It consists of a shank 72 that can be inserted into the capillary tool holder of an automated wire bonding system, in place of the capillary tool with the lower end of the shank tapered and terminating at a shearing head 74. The shank 72 is circular in cross-section, except for a chord 76 that is cut out to enable the shank to be held by the tool holder and properly oriented in the wire bonding system. Various types of programmable wire bonders, such as the Hughes Aircraft Company Autobonder HMC 2460 or 2470, may be employed for both moving the tool vertically and moving the chip in a horizontal plane with an X-Y table.

Figure 8B:
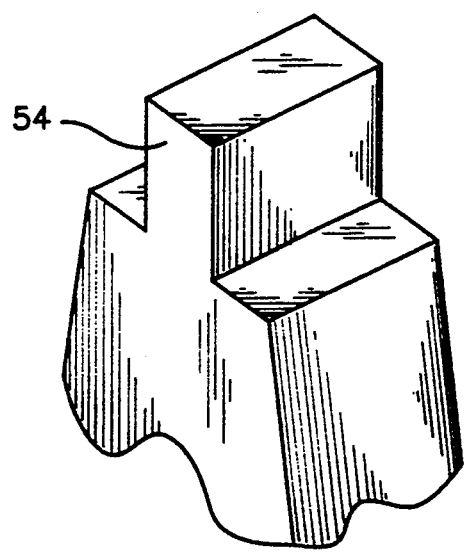
Figure 8C:
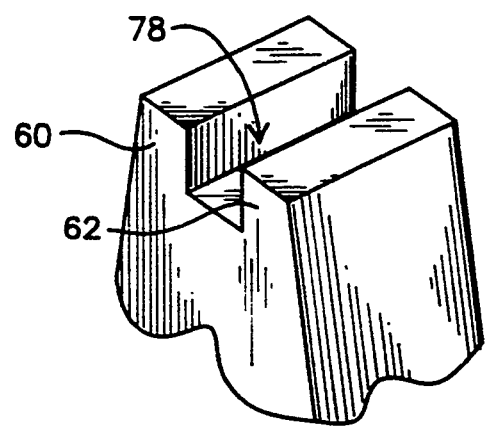

The shearing tool 72 can be made from titanium carbide, tool-grade steel or other hard machinable material. FIG. 8b shows the tool head with a single shearing projection 54 that is used for the unidirectional shearing operation of FIGS. 6a-6f. An alternate to the head configuration of FIG. 8b is shown in FIG. 8e. This head has a single projection 87 and can be used when high density lead wires are connected to the substrate. In FIG. 8c the tool head consists of the pair of spaced shearing projections 60 and 62, separated by a channel 78 that has a width slightly greater than the lead width. This tool head is useful for the reciprocating shearing action of FIGS. 7a-7e.

Figure 8D:
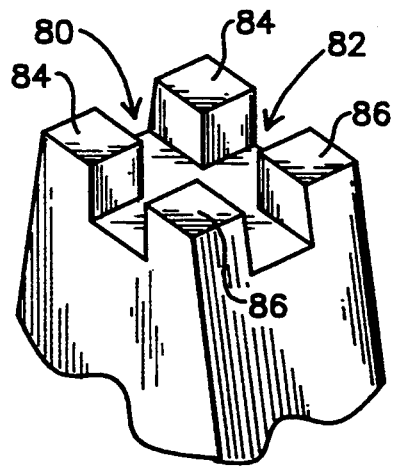
Figure 8E:
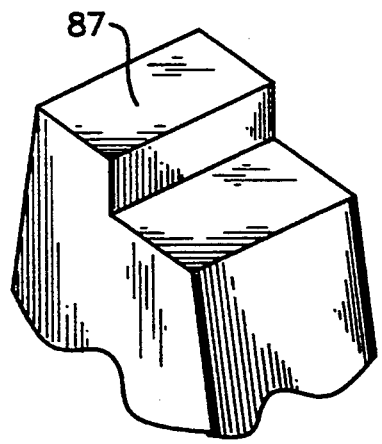

An alternate to the head configuration of FIG. 8C is shown in FIG. 8d. This head includes a pair of cross-channels 80 and 82, rather than the single channel 78 of FIG. 8c. The cross-channels 80 and 82 leave a pair of corner posts 84 at the two corners on one side of the head, and another pair of corner posts 86 at the two corners on the opposite side of the head. This head configuration can be formed by a conventional electron discharge machining operation. The corner posts 84 and 86 serve the same purpose as the spaced projections 60 and 62 of FIG. 8c, with their opposed walls alternately bearing against the sides of the lead during the reciprocating shearing action of FIGS. 7a-7e. The symmetrical construction of this head allows it to be used in either the X or the Y direction without rotation.

Figure 9:
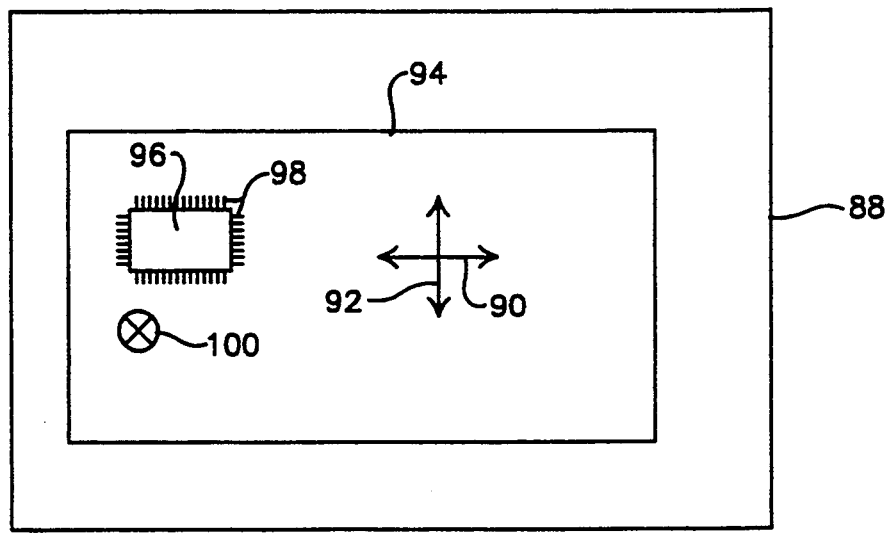
FIG. 9 is a illustrative plan view of an X-Y table and vertically adjustable shearing tool employed with the invention.

An illustrative overhead view of the setup for the rework operation, not to scale, is provided in FIG. 9. An X-Y table 88 is capable of moving in a horizontal plane in orthogonal X and Y reference directions, indicated by arrows 90 and 92, respectively. The substrate 94 is secured to the upper surface of the X-Y table 88. An IC chip 96 is shown adhered to the substrate 94, with lead wires 98 extending from the chip and bonded to respective underlying bonding pads (not shown). A shearing tool 100 as previously described is positioned over the table, and can be moved vertically in conjunction with horizontal movements of the table to shear off each of the leads 98 in succession. After the leads have been removed from their respective bonding pads, the substrate 94 is heated sufficiently to soften the adhesive that holds the chip 96, at which point the chip can be removed. It is then replaced by a substitute operative chip of similar design whose leads are bonded to the same bonding pads used for the original chip, with the bonding sites displaced from the bonding sites for the first chip as described above.

Figure 10:
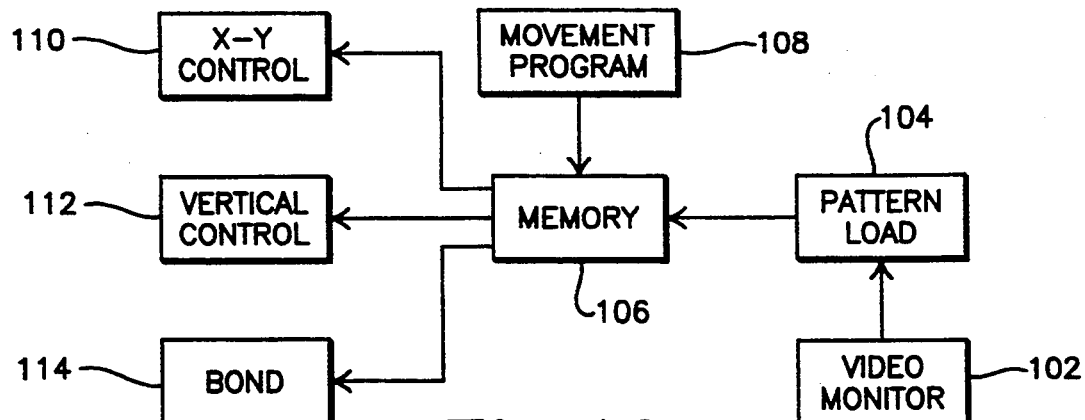
FIG. 10 is a block diagram of an automated control system for the invention.

The relevant control elements of a wire bonding machine that can be used to implement the invention are shown in block diagram form in FIG. 10. A video monitor 102 ascertains the chip and lead wire dimensions and geometries, and supplies them via a pattern load 104 to a control memory 106. With current wire bonder capabilities, the geometric patterns at different locations of the chip can initially be fed into memory and then recognized during the chip removal process to align the shearing tool with the chip. The memory 106 is also loaded with a user-supplied movement program 108 that establishes a pattern of shearing tool and X-Y table movements to shear the lead wires for a given chip. To switch to a different chip with a different lead wire configuration, the memory is re-programmed with another movement sequence designed for the new chip. Thus, different types of chips can be switched in and out by simply by re-programming the wire bonder. Since the programs for different chips can be provided in a permanent storage medium, changing from one chip to another can be accomplished very quickly by simply selecting the appropriate stored program.

The memory 106 governs an X-Y control 110 in the wire bonder that controls the relative movement between the shearing tool and the chip in a horizontal plane. Although the X-Y table is typically moved while the shearing tool is held stationary relative to a horizontal plane, this process could be reversed and the shearing tool moved horizontally while the chip is held stationary; the important factor is the net relative movement between the shearing tool and the leads which extend from the chip. The memory 106 also governs a vertical control mechanism 112 that controls the vertical movements of the shearing tool. Again, the substrate could be moved vertically relative to a stationary shearing tool if desired to achieve the necessary relative vertical movement between these two elements, although this type of movement would not be compatible with the capabilities of conventional wire bonding machines.

The system also includes a bonding control mechanism 114 that is used to control the formation of a bond between a lead and an underlying bonding pad. This function is used in connection with the invention to bond the leads of a replacement chip onto their bonding pads after an original defective chip has been removed.

Figure 11:
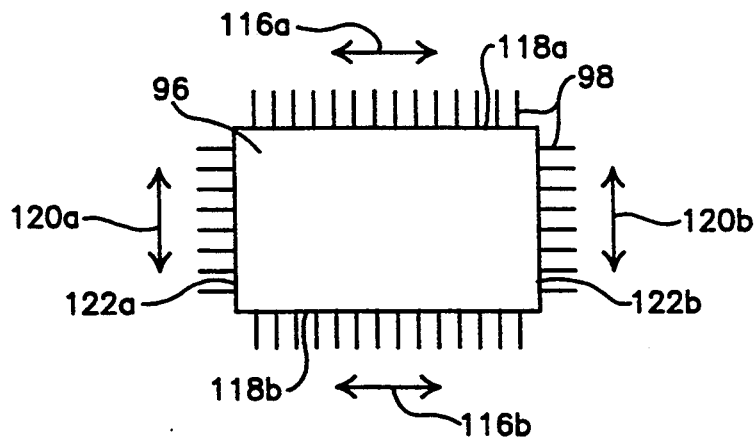
FIG. 11 is a diagram illustrating the relative movements of the X-Y table and shearing tool of FIG. 9 in dislodging a full array of leads from an IC circuit package.

Another advantage of the invention is that it allows all of the leads around the full circumference of a given chip to be removed from their respective bonding pads without having to rotate the chip. This is accomplished as indicated in FIG. 11, in which the leads 98 from chip 96 are sheared from their respective bonding pads by moving the chip along an X-axis (indicated by arrows 116a and 116b) to shear the leads extending from the upper and lower sides 118a, 118b, and moving the chip along a Y-axis indicated by arrows 120a and 120b to shear the leads extending from the left and right hand sides of the chip 122a and 122b, respectively. For this purpose the shearing projection from the shearing tool preferably has an X-Y symmetry when unidirectional shearing is desired, or is formed with symmetrical X-Y shearing surfaces as in FIG. 8d when bidirectional shearing is desired.

A single bonding pad of standard dimensions can thus be used to accommodate the leads from several successive IC chips, while maintaining a strong direct bond between each lead and the underlying bonding pad until the lead is removed. While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. An automated system for removing metallized leads of an electrical circuit device from respective metallized bonding pads to which the metallized leads have been bonded, comprising:
   a shearing tool,
   an automatic lead bonder adapted to receive said shearing tool,
   means for effecting relative movements between said shearing tool and the metallized leads of the electrical circuit device, and
   controller means for controlling said relative movement to cause said shearing tool to laterally shear the metallized leads in succession automatically from their respective metallized bonding pads.

2. The system of claim 1, said shearing tool including a single shearing projection that bears unidirectionally against said leads in succession under the control of said controller means to shear said leads from their respective bonding pads.

3. The system of claim 2, wherein said controller means establishes a lateral reciprocating movement of said shearing tool relative to each of said bonding pads, after said leads have been sheared from their respective pads, to clear debris from said bonding pads.

4. The system of claim 1, said shearing tool including a pair of shearing projections, wherein said controller means establishes a lateral bidirectional reciprocating movement of said shearing tool relative to each of said leads to shear said leads from their respective bonding pads.

5. The system of claim 4, said leads being initially bonded to their respective bonding pads under a spring pressure that urges said leads upward from their respective bonding pads, wherein said controller means continues said lateral bidirectional reciprocating movement for each lead until said lead is dislodged from its respective bonding pad and lifts off said bonding pad under said spring pressure.

6. The system of claim 1, said shearing tool including at least one shearing projection, wherein said controller means aligns said shearing tool with a first one of said leads by aligning said tool over a reference surface for said first lead, lowers said tool so that its shearing projection contacts the reference surface for said first lead lateral to said first lead, and then lifts said tool until its shearing projection is a predetermined shearing height above said reference surface.

7. The system of claim 6, wherein said at least one shearing projection extends downward from said shearing tool by a distance greater than the height of said leads.

8. The system of claim 6, wherein said controller means aligns said shearing tool with the other leads subsequent to said first lead in succession lateral to said other leads, and lowers the tool directly to a shearing height for said other leads based upon the distance the tool was lowered to contact the reference surface for said first lead.

9. The system of claim 1, said means for effecting relative movements between said tool and said leads comprising a moveable table for supporting said electrical circuit device and moving it in a horizontal plane for said shearing and for advancing the shearing tool among said leads, wherein said shearing tool is vertically adjustable under the control of said controller means to position said shearing tool at a shearing height for each of said leads and to clear said leads during the advancement of said shearing tool among said leads.

* * * * *